United States Patent
Loh et al.

(10) Patent No.: US 7,960,819 B2
(45) Date of Patent: Jun. 14, 2011

(54) LEADFRAME-BASED PACKAGES FOR SOLID STATE EMITTING DEVICES

(75) Inventors: Ban P. Loh, Durham, NC (US); Bernd Keller, Santa Barbara, CA (US); Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 65 days.

(21) Appl. No.: 11/486,244

(22) Filed: Jul. 13, 2006

(65) Prior Publication Data
US 2008/0121921 A1 May 29, 2008

(51) Int. Cl.
*H01L 23/495* (2006.01)
(52) U.S. Cl. .................. 257/676; 257/99; 257/E23.031
(58) Field of Classification Search .................... 257/98, 257/99, 100, 676, E33.057, E33.058, E33.072, 257/E33.073, 666, 79, 684, 796, 675, 712, 257/713, 717, 720, E23.031
See application file for complete search history.

(56) References Cited

U.S. PATENT DOCUMENTS

| | | | |
|---|---|---|---|
| 5,748,658 A | 5/1998 | Nakanishi et al. | |
| 5,770,096 A | 6/1998 | Lee | |
| 6,376,902 B1 | 4/2002 | Arndt | |
| 6,455,356 B1 * | 9/2002 | Glenn et al. | 438/123 |
| 6,469,321 B2 | 10/2002 | Arndt | |
| 6,573,580 B2 | 6/2003 | Arndt | |
| 6,680,491 B2 * | 1/2004 | Nakanishi et al. | 257/98 |
| 6,716,673 B2 | 4/2004 | Waitl et al. | |
| 6,747,293 B2 * | 6/2004 | Nitta et al. | 257/99 |
| 7,034,382 B2 * | 4/2006 | Palmteer et al. | 257/676 |
| 7,045,905 B2 | 5/2006 | Nakashima | |
| 7,253,448 B2 | 8/2007 | Roberts et al. | |
| 7,282,785 B2 | 10/2007 | Yoshida | |
| 2001/0000622 A1 * | 5/2001 | Reeh et al. | 257/98 |
| 2002/0004251 A1 | 1/2002 | Roberts et al. | |
| 2002/0163001 A1 * | 11/2002 | Shaddock | 257/79 |

(Continued)

FOREIGN PATENT DOCUMENTS

CN  1148637 A  4/1997

(Continued)

OTHER PUBLICATIONS

SnapLED 150 Technical Data DS08, Lumileds Lighting, LLC, Oct. 11, 2004, pp. 1-6.

(Continued)

*Primary Examiner* — Evan Pert
*Assistant Examiner* — Selim Ahmed
(74) *Attorney, Agent, or Firm* — Myers Bigel Sibley & Sajovec

(57) ABSTRACT

A modular package for a light emitting device includes a leadframe having a top surface and including a central region having a bottom surface and having a first thickness between the top surface of the leadframe and the bottom surface of the central region. The leadframe may further include an electrical lead extending away from the central region. The electrical lead has a bottom surface and has a second thickness from the top surface of the leadframe to the bottom surface of the electrical lead. The second thickness may be less than the first thickness. The package further includes a package body on the leadframe surrounding the central region and exposing the bottom surface of the central region. The package body may be at least partially provided beneath the bottom surface of the lead and adjacent the bottom surface of the central region. Methods of forming modular packages and leadframes are also disclosed.

16 Claims, 6 Drawing Sheets

U.S. PATENT DOCUMENTS

| | | | |
|---|---|---|---|
| 2004/0041222 A1* | 3/2004 | Loh | 257/433 |
| 2004/0079957 A1 | 4/2004 | Andrews et al. | |
| 2004/0080026 A1* | 4/2004 | Minamio et al. | 257/666 |
| 2004/0126913 A1 | 7/2004 | Loh | |
| 2005/0077623 A1* | 4/2005 | Roberts et al. | 257/724 |
| 2005/0189626 A1* | 9/2005 | Xiaochun et al. | 257/666 |
| 2005/0218421 A1* | 10/2005 | Andrews et al. | 257/100 |
| 2005/0218489 A1* | 10/2005 | Satou et al. | 257/678 |
| 2005/0269587 A1 | 12/2005 | Loh et al. | |
| 2006/0124953 A1* | 6/2006 | Negley et al. | 257/99 |
| 2006/0223238 A1* | 10/2006 | Koh et al. | 438/123 |

FOREIGN PATENT DOCUMENTS

| | | |
|---|---|---|
| CN | 1638158 A | 7/2005 |
| CN | 1808713(A) | 7/2006 |
| JP | 2000-252323 | 9/2000 |
| JP | 2005-197369 | 7/2005 |

OTHER PUBLICATIONS

Luxeon® Star power light source Technical Datasheet DS23, Lumileds Lighting, LLC, Mar. 2006, pp. 1-18.

Declaration of Gerald Negley under 37 C.F.R. § 1.132, dated Aug. 21, 2009.

Declaration of Charles Swoboda under 37 C.F.R. § 1.132, dated Aug. 21, 2009.

First Office Action for corresponding Chinese Patent Application No. 200710142165.2 dated Mar. 24, 2010, 16 pages.

Translation of First Office Action for Chinese Patent Application No. 200810003832.3 dated Sep. 14, 2010.

Translation of Second Chinese Office Action for corresponding Chinese Application No. 200710142165.2 mailed Mar. 4, 2011.

* cited by examiner

LEADFRAME-BASED PACKAGES FOR SOLID STATE EMITTING DEVICES

FIELD OF THE INVENTION

This invention relates to solid state light emitting devices, and more particularly to packages for solid state light emitting devices and methods of forming packages for solid state light emitting devices.

BACKGROUND

It is known to mount solid state light sources, such as semiconductor light emitting devices, in packages that may provide protection, color selection, focusing, and the like, for light emitted by the light emitting device. A solid state light emitting device may be, for example, an organic or inorganic light emitting diode ("LED"). Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

Packages as described in the above referenced publications may be suitable for high power, solid state illumination applications. However, notwithstanding the advances described therein, there remains a need for improved packages in which multiple LEDs may be mounted. In particular, in some general lighting applications it may be desirable for an LED package to include multiple LEDs emitting in different regions of the visible spectrum. Light emitted by the LEDs may combine to produce a desired intensity and/or color of light, such as white light or any other desired color. In that case, it may be desirable for the LEDs in the package to be mounted relatively closely together.

A typical leadframe-based LED package includes electrical leads, contacts or traces for electrically connecting the LED package to an external circuit. In a typical LED package 10 illustrated in FIG. 1A, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. However, heat retention may be an issue for a package such as the package 10 shown in FIG. 1A, since it may be difficult to extract heat through the leads 15A, 15B.

A conventional surface-mountable leadframe-based package 20 is illustrated in FIG. 1B. The package 20 includes an LED chip 22 mounted on a reflective cup 23. One or more wirebonds 21 connect the ohmic contacts of the LED chip 22 to leads 25A and/or 25B, which may be attached to or integral with the reflective cup 23. A clear protective resin 24 is cast around the assembly. The reflective cup 23 may be formed by stamping a thin sheet of metal when the leadframe is formed. Stamping the reflective cup 23 may result in thinning of the base and/or sidewalls of the cup 23. However, since heat may be extracted through the leads 25A, 25B, the thickness of the cup 23 may not limit the thermal performance of the package 20. The package 23 may have more and/or larger leads 25A, 25B compared to the package 10 of FIG. 1A. However, since heat is extracted out of the package through the leads 25A, 25B, the package may still have a thermal resistance that limits the performance of the device.

SUMMARY

A modular package for a light emitting device according to some embodiments of the invention includes a leadframe having a top surface and including a central region having a bottom surface and having a first thickness between the top surface of the leadframe and the bottom surface of the central region. The leadframe may further include an electrical lead extending laterally away from the central region. The electrical lead has a bottom surface and has a second thickness from the top surface of the leadframe to the bottom surface of the electrical lead adjacent the central region. The second thickness may be less than the first thickness. The package further includes a package body on the leadframe surrounding the central region and exposing the bottom surface of the central region. The package body may be at least partially provided beneath the bottom surface of the lead and adjacent the bottom surface of the central region.

The central region may include a die mounting region, and the electrical lead may be isolated from the die mounting region. The package body may include upper sidewalls that define an optical cavity above the die mounting region.

The upper sidewalls may include oblique inner surfaces that define a reflector cup surrounding the die mounting region.

The modular package may further include an encapsulant above the reflector cup, the encapsulant defining a lens above the reflector cup.

In some embodiments, the modular package may further include a circumferential rim surrounding the die mounting region, and a lens on the circumferential rim. The modular package may further include a circumferential moat surrounding the circumferential rim.

The package body may define an optical cavity above the top surface of the die mounting pad, and at least a portion of the package body may extend through the leadframe.

The central region may include a reflector cup therein including oblique sidewalls extending from an upper corner of the reflector cup to a base of the reflector cup. A third thickness between the base of the reflector cup and the bottom surface of the central region may be greater than the second thickness. A width of the central region may be greater than a width of the base of the reflector cup. Furthermore, a width of the central region may be greater than or equal to a width of the reflector cup at the upper corner thereof.

The modular package may further include a submount on the base of the reflector cup, a solid state light emitting device on the submount, and a wirebond connection from the solid state light emitting device to the electrical lead.

The package body may include upper sidewalls that define an optical cavity above the reflector cup. The reflector cup may include a first reflector cup and the upper sidewalls include oblique inner surfaces that define a second reflector cup surrounding the first reflector cup. The modular package may further include a encapsulant above the reflector cup, the encapsulant forming a lens above the reflector cup. The modular package may further include a circumferential rim surrounding the reflector cup and a lens on the circumferential rim. The modular package may further include a circumferential moat surrounding the circumferential rim.

The package body has a bottom surface that may be substantially coplanar with the bottom surface of the central region of the leadframe.

The modular package may further include a plurality of electrical leads, and the central region may include a plurality of die mounting pads that are electrically connected to respective ones of the plurality of electrical leads and that are configured to receive a light emitting device.

The leadframe may have a thickness less than 30 mils. In some embodiments, the leadframe may have a thickness of about 15 mils.

A leadframe for a package for a light emitting device according to some embodiments of the invention includes a top surface and a central region having a bottom surface and having a first thickness between the top surface of the leadframe and the bottom surface of the central region. The leadframe further includes an electrical lead extending laterally away from the central region. The electrical lead has a bottom surface and a second thickness from the top surface of the leadframe to the bottom surface of the electrical lead adjacent the central region. The second thickness may be less than the first thickness.

The central region may include a reflector cup therein including oblique sidewalls extending from an upper corner of the reflector cup to a base of the reflector cup. A third thickness between the base of the reflector cup and the bottom surface of the central region may be greater than the second thickness. A width of the central region may be greater than a width of the base of the reflector cup. A width of the central region may be greater than or equal to a width of the reflector cup at the upper corner thereof.

Some embodiments of the invention provide methods of forming a package for a solid state light emitting device. The methods include providing a leadframe having a top surface and including a central region having a bottom surface and having a first thickness between the top surface of the leadframe and the bottom surface of the central region and including an electrical lead extending laterally away from the central region, the electrical lead having a bottom surface and a second thickness from the top surface of the leadframe to the bottom surface of the electrical lead adjacent the central region. The second thickness may be less than the first thickness. The methods further include forming a package body on the leadframe surrounding the central region and exposing the bottom surface of the central region. The package body may be at least partially formed beneath the bottom surface of the lead and adjacent the bottom surface of the central region.

The central region may include a die mounting region, and the package body may include upper sidewalls that define an optical cavity above the die mounting region and that include oblique inner surfaces that define a reflector cup surrounding the die mounting region, and the methods may further include dispensing an encapsulant in the reflector cup. The encapsulant may form a lens above the reflector cup. The methods may further include positioning a lens above the reflector cup.

The package body may further include a circumferential rim surrounding the die mounting region, and positioning the lens above the reflector cup may include bringing the lens into contact with the circumferential rim.

The central region may include a reflector cup therein including oblique sidewalls extending from an upper corner of the reflector cup to a base of the reflector cup. A third thickness between the base of the reflector cup and the bottom surface of the central region may be greater than the second thickness. The methods may further include positioning a submount on the base of the reflector cup, positioning a solid state light emitting device on the submount, and forming a wirebond connection from the solid state light emitting device to the electrical lead.

Forming the package body may include forming the package body to expose a bottom surface of the central region of the leadframe.

The methods may further include dispensing an encapsulant into the reflector cup. The encapsulant may form a lens above the reflector cup.

The package body may further include a circumferential rim surrounding the die mounting region, and the methods may further include bringing a lens into contact with the circumferential rim.

Methods of forming a leadframe for a solid state light emitting package according to some embodiments of the invention include providing a leadframe blank having a top surface, a central region having a bottom surface and having a first thickness between the top surface of the leadframe blank and the bottom surface of the central region, and a portion extending laterally away from the central region, the portion extending away from the central region having a bottom surface and a second thickness adjacent the central region from the top surface of the leadframe to the bottom surface of the portion extending away from the central region, and stamping a reflector cup into the central region. The second thickness may be less than the first thickness.

Stamping the reflector cup into the central region may include bringing a stamp including a protrusion having a shape defining a desired shape of the reflector cup into contact with the upper surface of the leadframe blank above the central region, and applying sufficient energy to the stamp to impress an image of the protrusion into the central region of the leadframe blank.

The methods may further include trimming excess material squeezed out while stamping the reflector cup from the leadframe blank.

The reflector cup may include oblique sidewalls extending from an upper corner of the reflector cup to a base of the reflector cup, and a third thickness between the base of the reflector cup and the bottom surface of the central region may be greater than the second thickness. A width of the central region may be greater than a width of the base of the reflector cup. A width of the central region may be greater than or equal to a width of the reflector cup at the upper corner thereof.

Methods of forming a leadframe for a solid state light emitting package according to further embodiments of the invention include providing a leadframe blank having a top surface and a bottom surface, and selectively etching the leadframe blank to provide a first region having a bottom surface and having a first thickness between the top surface of the leadframe blank and the bottom surface of the region, and a second region having a bottom surface and a second thickness from the top surface of the leadframe to the bottom surface of the second region. The second thickness may be less than the first thickness. The first thickness may be less than 30 mils. The first thickness may be about 15 mils. Selectively etching the leadframe blank may include selectively etching the leadframe blank to form a recess in the leadframe having a depth of about 10 mils.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
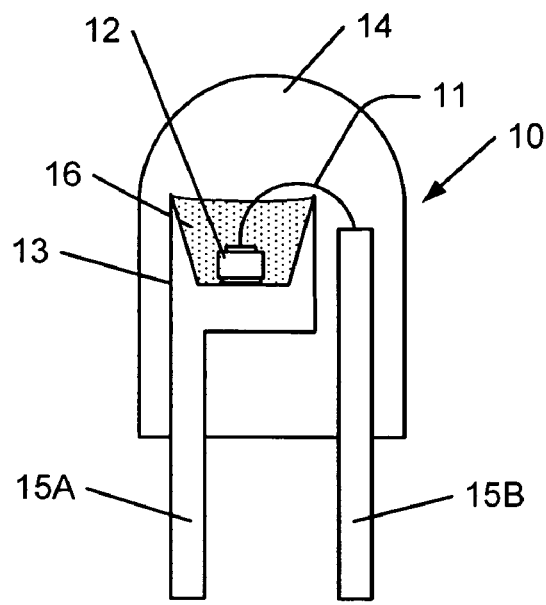
FIGS. 1A and 1B are cross-sectional side views illustrating conventional packages for light emitting devices.
Figure 1B:
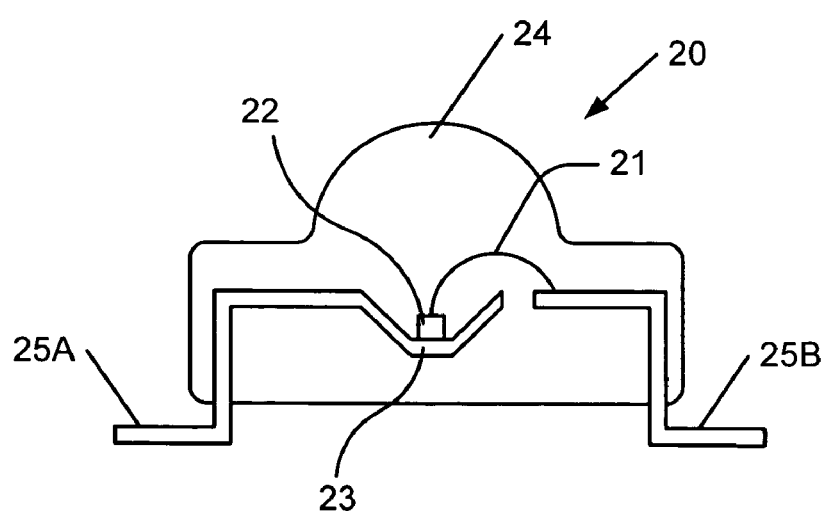

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices are well known to those having skill in the art and need not be described in detail herein.

For example, the semiconductor light emitting devices packaged in accordance with embodiments of the invention may be gallium nitride-based LEDs or lasers fabricated on a silicon carbide substrate such as those devices manufactured and sold by Cree, Inc. of Durham, N.C. The LEDs and/or lasers may be configured to operate such that light emission occurs through the substrate in a so-called "flip chip" orientation.

Figure 2A:
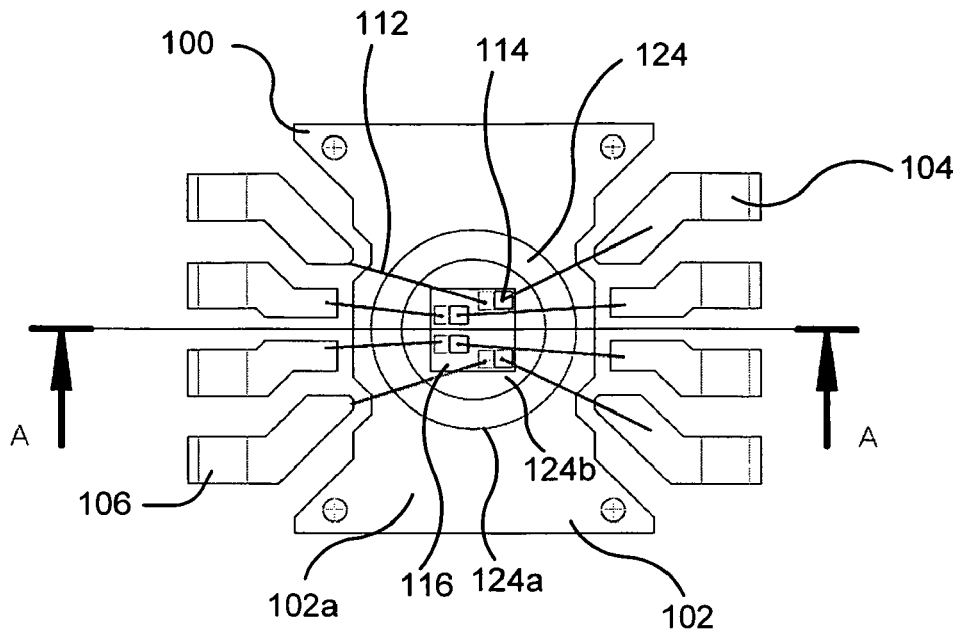
FIG. 2A is a top view and FIGS. 2B and 2C are a cross-sectional side views illustrating a leadframe for one or more light emitting devices according to some embodiments of the present invention.
Figure 2B:
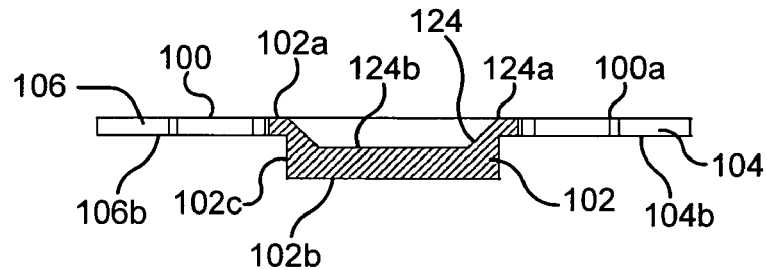
Figure 2C:
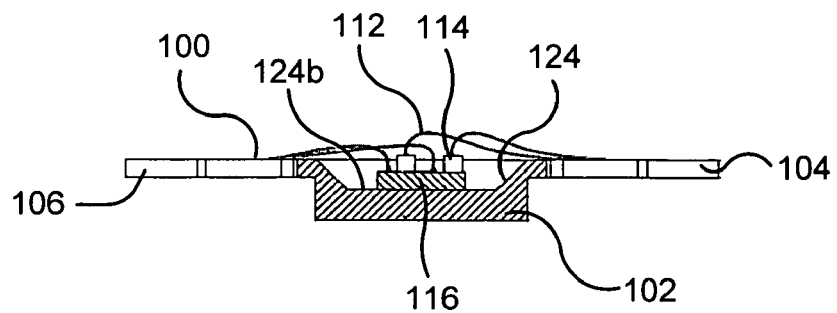

Referring now to FIGS. 2A-2C, a leadframe 100 according to some embodiments of the invention is illustrated. FIG. 2A is a top view of the leadframe 100, while FIGS. 2B and 2C are cross sections taken along line A-A of FIG. 2A. The leadframe 100 includes a central region 102 and a plurality of leads 104, 106 extending away from the central region 102. The electrical leads 104, 106 may be electrically isolated from one another and/or from the central region 102 of the leadframe 100. The leads may be arranged such that leads of opposite polarity type (e.g. anodes or cathodes) are provided on opposite sides of the leadframe 100, which may facilitate the connection of packages using the leadframes 100 in series.

As shown in FIG. 2A, the leadframe 100 further has an upper surface 100a. The central region 102 of the leadframe 100 has a substantially flat lower surface 102b that is spaced apart from lower surfaces 104b, 104c of the leads 104, 106 by sidewalls 102c. The central region 102 has a first thickness (i.e. the distance between the upper surface 100a of the leadframe 100 and the lower surface 102b of the central region 102), and the electrical leads 104, 106 have a second thickness (i.e. the distance between the upper surface 100a of the leadframe 100 and the lower surface 104b, 106b of the respective leads 104, 106) that is less than the first thickness.

A reflector cup 120 is formed in the central region 102. The reflector cup 124 includes an oblique sidewall that extends from the upper surface 100a of the leadframe 100 to a base 124b located within the central region 102. The reflector cup 124 may have an arbitrary peripheral shape. However, in the embodiments illustrated in FIGS. 2A-2C, the reflector cup 124 has a generally circular peripheral shape. Thus, the oblique sidewall of the reflector cup 124 may form a generally circular upper lip 124a where the reflector cup 124 intersects the upper surface 100a of the leadframe 100. The sidewall of the reflector cup 124 shown in FIGS. 2A-C has the shape of a conic section (e.g. a frustum). However, the sidewall of the reflector cup 124 may form other shapes, for example, a solid parabolic section.

The base 124b of the reflector cup 124 has a diameter that is less than a width of the central region 102 (i.e. a distance between the sidewalls 102c of the central region 102). Furthermore, the upper lip 124a of the reflector cup 124 has a diameter that may be less than or equal to the width of the central region 102. Moreover, the thickness of the central region 102 between the base 124b of the reflector cup 124 and the lower surface 102b of the central region 102 may be thicker than electrical leads 104, 106. As will be explained in greater detail below, a package for a solid state light emitting device may dissipate heat through the central region 102 of the leadframe 100, rather than through the leads 104, 106. Thus, the relative physical dimensions of the central region 102 may improve the heat dissipation properties of the package by reducing the thermal resistance of the package.

Thermal resistance is inversely proportional to the surface area through which heat is conducted. That is, thermal resistance is defined by the equation $$R_{TH}=L/kA \qquad (1)$$

where k is the coefficient of thermal conductivity, L is the length of the material through which heat is to be dissipated, and A represents the area through which heat is to be dissipated. Thus, when heat is dissipated through a large surface such as the lower surface 102b of the central region 102, the thermal resistance of the package may be lowered. Furthermore, while according to equation (1) the greater thickness of the central region 102 may increase the thermal resistance of the package somewhat, the thickness of the central region 102 may permit heat to spread more before it is extracted from the package. Since heat in an LED package is generated in a relatively small area (i.e. the area of the light emitting devices 114), it may be desirable to increase the thickness of the central region 102 in order to take better advantage of the relatively large surface area of the central region 102.

Referring to FIG. 2C, a submount 116 including a plurality of solid state light emitting devices 114 is mounted within the reflector cup 124 on the base 124b thereof. The submount 116 may include a nonconductive material such as aluminum nitride, silicon carbide and/or chemical vapor deposited (CVD) diamond on which a plurality of electrical traces (not shown) may be formed. The thermal conductivity of aluminum nitride and silicon carbide is about 400 W/MK, while the thermal conductivity of CVD diamond is about 800 W/MK. The thickness of the submount 116 may be from about 300 to about 600 µm, although other thicknesses may be used. A plurality of wirebond connections 112 are made between the submount 116 and the devices 114 on one hand and respective ones of the electrical leads 104, 106 on the other hand.

Figure 3A:
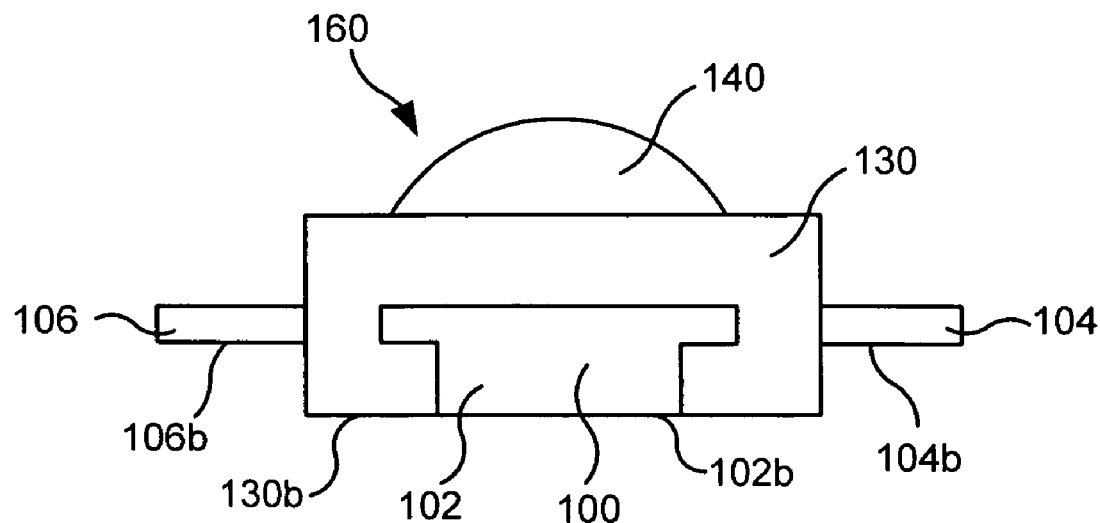
FIG. 3A is a side view and FIG. 3B is a cross sectional side view of a package for one or more light emitting devices according to some embodiments of the invention.
Figure 3B:
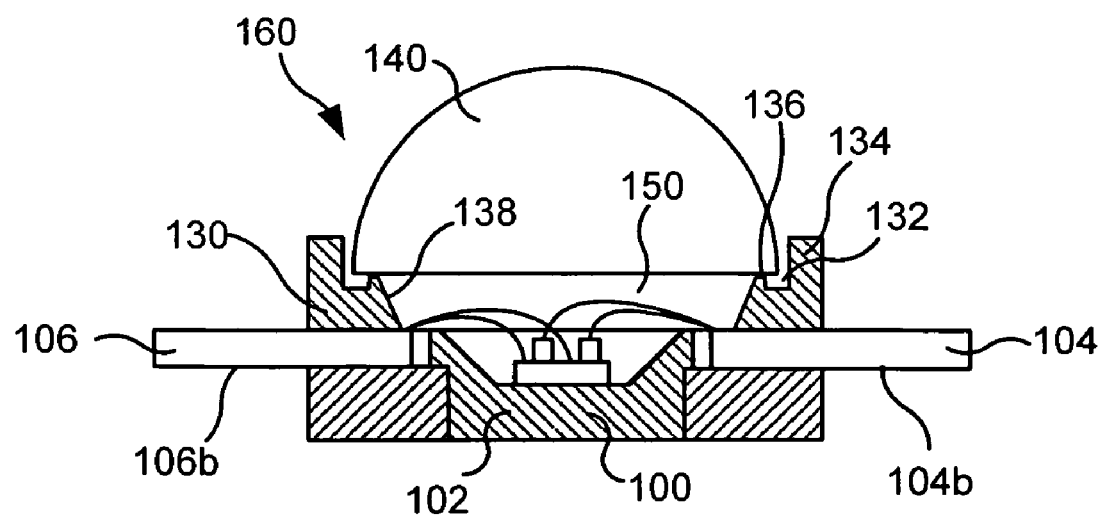

A package 160 including the leadframe 100 is illustrated in FIGS. 3A and 3B, which are side and cross sectional side views, respectively, of a package 160 for one or more light emitting devices. Referring to FIGS. 3A and 3B, the package 160 includes a molded package body 130 surrounding the leadframe 100 and a lens 140 mounted over the central region 102 of the leadframe 100. The electrical leads 104, 106 extend from sides of the package body 130. Other optical features, such as reflectors, diffusers, etc., may be provided instead of or in addition to the lens 140.

The package body 130 may be formed, for example, of thermoplastic by transfer or injection molding, around the leadframe 100. The thermoplastic may include a liquid crystal polymer such as a Vectra® series polymers A130 and/or S135 available from Ticona Engineering Polymers. Other suitable liquid crystal polymers are available from Solvay Advanced Polymers. Polycarbonate, Lexan® from GE Polymers and/or polyphthalamide may also be used as the thermoplastic for the package body 130. The package body 130 may expose the bottom surface 102b of the central region 102 of the leadframe 100. The package body 130 may extend at least partially between lower surfaces 104b, 106b of the leads 104, 106 and a lower surface 102b of the central region 102 of the leadframe 100 while exposing at least a portion of the lower surface 102b of the central region 102. Further, the package body 130 may have a bottom surface 130b that is coplanar with the bottom surface 102b of the central region 102 of the leadframe 100. However, in some embodiments, the bottom surface 102b of the central region 102 of the leadframe 100 and the bottom surface 130b of the package body 130 may not be coplanar. For example, the bottom surface 130b of the package body 130 may extend away from the bottom surface 102b of the central region 102 of the leadframe 100. In other embodiments, the central region 102 may extend away from the package body 130. When the package 160 is mounted, the exposed surface 100b of the leadframe 100 may be placed into thermal contact with, for example, an external heatsink (not shown).

As shown in FIG. 3B, the package body 130 may be formed to expose an upper surface of the central region 102 of the leadframe 100 including the reflector cup 120. The package body 130 may include opposing upper sidewalls 134 that define an optical cavity 150 above the reflector cup 120 and the submount 116. The upper sidewalls 134 may include oblique inner surfaces that define a second reflector cup 138 above and surrounding the first reflector cup 124. The lens 140 may be positioned at least partially within the optical cavity 150 above the reflector cup 120. The reflector cup 120 and the optical cavity 150 defined by the package body 130 may be filled, for example, with a liquid encapsulant material, such as liquid silicone and/or epoxy, which may include a wavelength conversion material, such as a phosphor, therein.

The lens 140 may be positioned in contact with a circumferential rim 136 that may be defined within the sidewalls 134 as shown in FIG. 3B and/or may be a separate feature of the body 130. The circumferential rim 136 may determine the vertical position of the lens 140 in relation to the solid state light emitting devices 114 in the reflector cup 120. Furthermore, the sidewalls 134 may include a circumferential moat 132 outside the circumferential rim 136. The circumferential moat 132 may be particularly useful when a liquid encapsulant such as silicone is used as an encapsulant for the package 160, as explained below.

In a process of assembling a package according to some embodiments of the invention, a liquid encapsulant is dispensed into the cavity 150 defined by the package body 130. The lens 140 is then lowered into the cavity 150, where it may contact the liquid encapsulant. When the liquid encapsulant is cured, it may act as a glue to hold the lens 140 in place in the package 160. When the lens 140 is placed in contact with the liquid encapsulant, some of the encapsulant may squeeze up around the lens 140, potentially interfering with the optical/mechanical properties of the package 160. In embodiments of the invention including a circumferential moat 132 surrounding a circumferential rim 136, the lens 140 is inserted into the cavity 150 until it contacts the circumferential rim 136. Thus, the height of the circumferential rim 136 may precisely determine the spacing between the lens 140 and the solid state light emitting devices 114, which may improve the optical uniformity from package to package. Excess liquid encapsulant material may flow preferentially into the circumferential moat 132 instead of flowing up and around the lens 140. The use of circumferential edges and moats for control of encapsulant materials and lens placement is described in detail in U.S. Pre-grant Publication No. 2005/0218421 entitled "Methods For Packaging A Light Emitting Device And Packaged Light Emitting Devices", which is assigned to the assignee of the present invention, the disclosure of which is incorporated herein by reference.

Figure 4A:
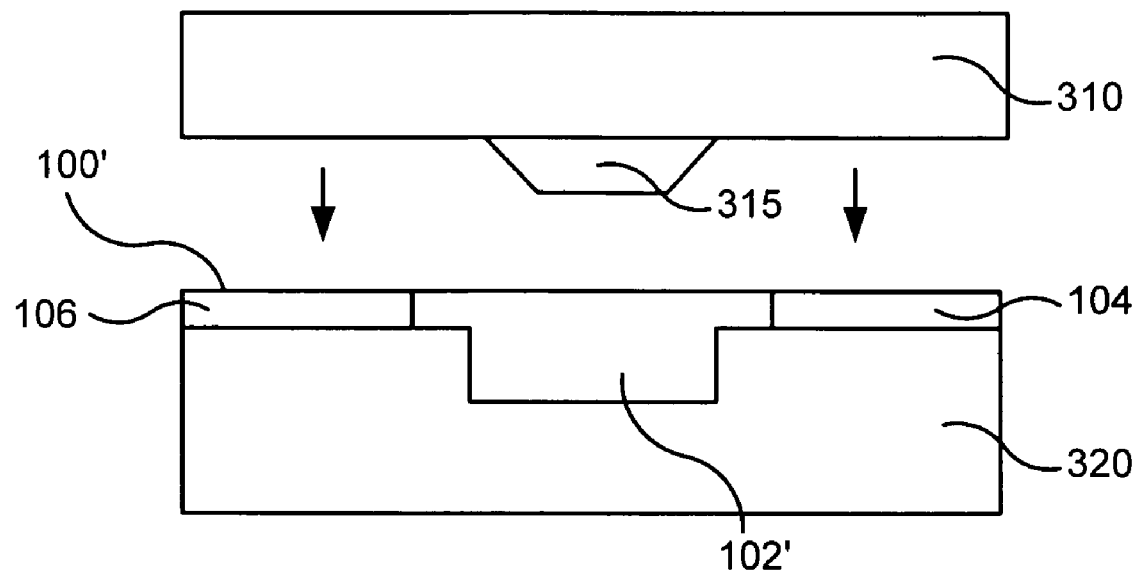
FIGS. 4A and 4B are schematic diagrams illustrating the formation of a lead frame according to some embodiments of the invention.
Figure 4B:
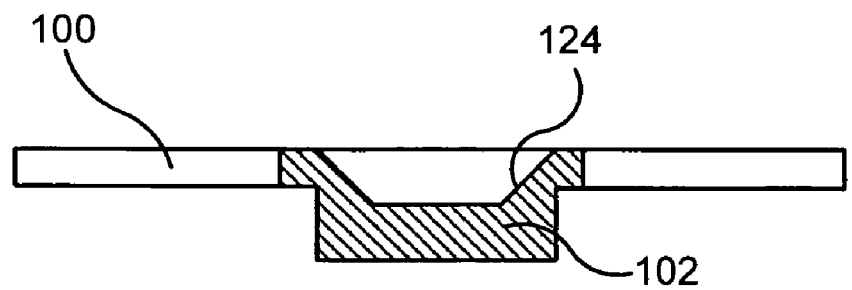

Formation of a leadframe 100 according to embodiments of the invention is illustrated in FIGS. 4A and 4B. As shown therein, a leadframe blank 100' includes a central region 102' and leads 104, 106 extending away from the central region 102'. The blank may be formed, for example, of copper, aluminum or another metal having high thermal conductivity. The central region 102' may have a thickness of about 550 µm, while the leads 104, 106 may have a thickness of about 250 µm. The central region 102' has a thickness that is greater than the thickness of the leads 104, 106. The blank 100' is placed in a support member 320 that is shaped to receive the blank 100'. A stamp 310 including a protrusion 315 is brought into contact with the blank 100', and sufficient energy (e.g. force and/or heat) is applied to impress an image of the protrusion 315 into the central region 102'. The protrusion 315 may have angled sidewalls and may have a width that is less than the width of the central region 102', so that the protrusion 315 creates a reflector cup 124 within the central region 102'. Excess material (not shown) that may be squeezed out when the reflector cup 124 is formed may be trimmed off of the completed leadframe 100.

Figure 5:
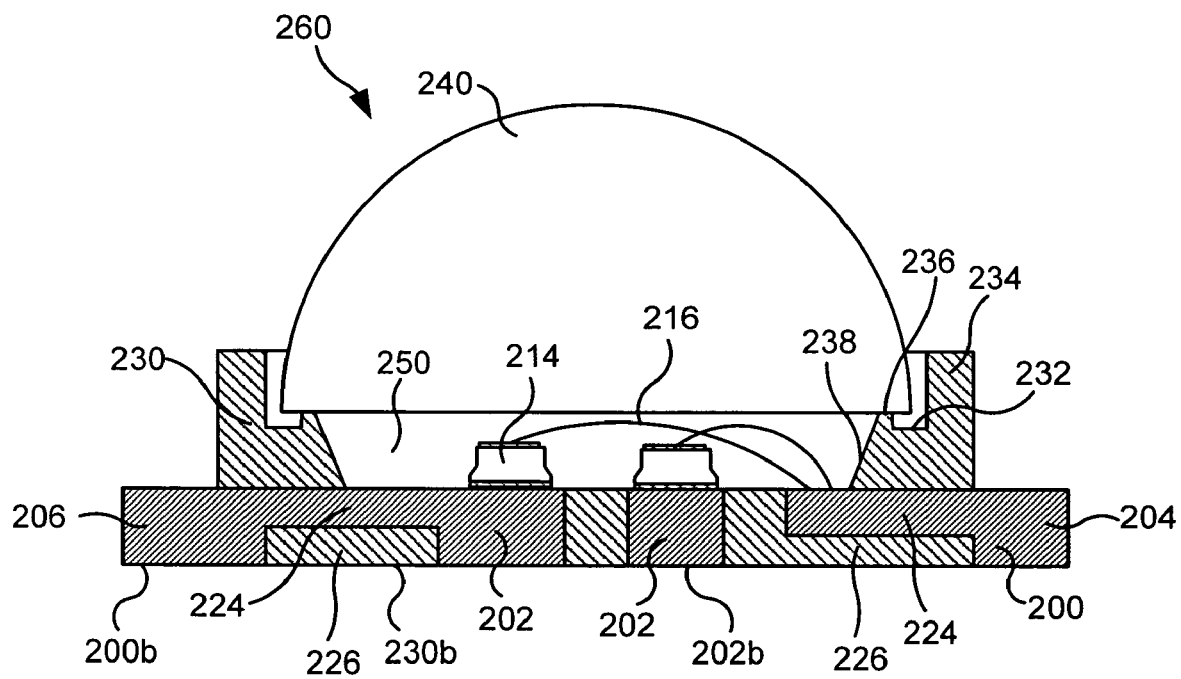
FIG. 5 is a cross sectional side view of a package for one or more light emitting devices according to further embodiments of the invention.

A solid state lighting package 260 according to further embodiments of the invention is illustrated in FIG. 5. The package 260 includes a leadframe 200 including a plurality of die mounting regions 202 located in a central region of the leadframe 200 and a plurality of electrical leads 204, 206 extending away from the die mounting regions. Both the upper and lower surfaces of the die mounting regions 202 are exposed. In the embodiments illustrated in FIG. 5, respective ones of the first electrical leads 206 are formed integral with corresponding ones of the die mounting regions 202, while the second electrical leads 204 are electrically isolated from the die mounting regions 202.

Figure 6:
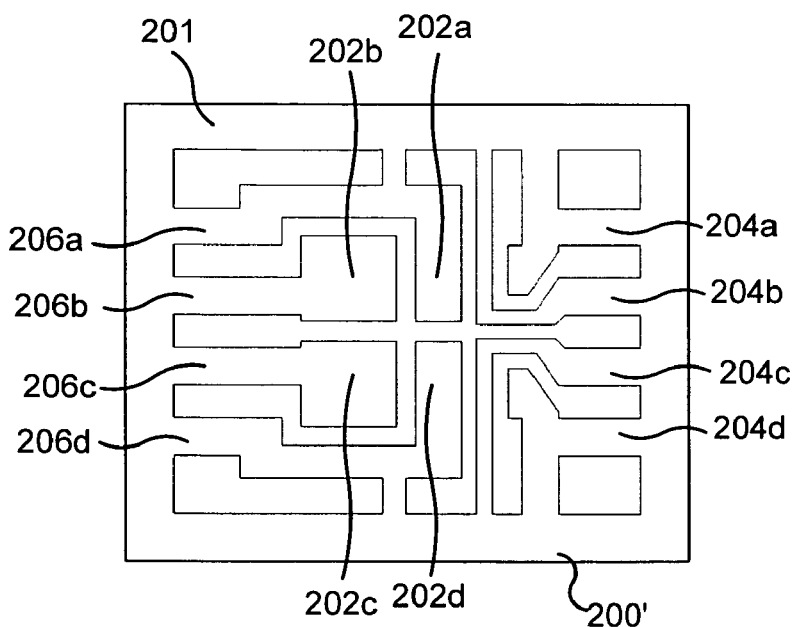
FIG. 6 is a top view of a leadframe configured for use in a package according to embodiments of the invention.

A leadframe blank 200' is shown in top view in FIG. 6. The leadframe blank 200' includes four die mounting regions 202a-d that are formed integral to four corresponding leads 206a-d. The blank 200' further includes four electrical leads 204a-d that are isolated from the die mounting regions 202a-d. The die mounting regions 202a-d and leads 204a-d and 206a-d are held in place by an external frame 201 that may be trimmed off after a package body is molded onto the leadframe blank 200'. The leadframe blank 200' may be made of a metal having a low thermal resistance such as copper, and may be less than about 30 mils thick. In some embodiments, the leadframe may be less than about 15 mils thick. As explained below, the leadframe 200 may be substantially thinner than a typical leadframe, since the leadframe 200 may be mounted directly onto an external heatsink, so that heat is extracted from the leadframe through a large surface area opposite the surface of the die mounting region 202a-d of the leadframe 200 on which the light emitting devices 214 are mounted.

Returning to FIG. 5, the leadframe 200 further includes regions 224 of reduced thickness that define recesses 226 in the leadframe 200. The reduced thickness regions 224, 226 may be formed, for example, by selectively etching portions of the leadframe 200. A package body 230 is formed on/around the leadframe, for example by transfer or injection molding.

The package body 230 may expose the bottom surface 202b of the die mounting regions 202, as well as other portions of the bottom surface of the leadframe 200. Further, the package body 230 may have a bottom surface 230b that is coplanar with the bottom surface 200b of the leadframe 200. However, in some embodiments, the bottom surface 202b of the die mounting regions 202 of the leadframe 200 and the bottom surface 230b of the package body 230 may not be coplanar. For example, the bottom surface 230b of the package body 230 may extend beyond the bottom surface 202b of the die mounting regions 202 of the leadframe 200. In other embodiments, the die mounting regions 202 may extend beyond the package body 230. When the package 260 is mounted, the exposed surface 200b of the leadframe 200 may be placed into thermal contact with, for example, an external heatsink (not shown).

The package body 230 may further be formed to fill the recesses 226 defined by the reduced thickness regions 224 of the leadframe 200. Thus, the package body 230 may extend, at least partially, from a lower surface of the reduced thickness regions 224 to a lower surface 200b of the leadframe 200. By filling the recesses 226 with the package body 230, the package body 230 may form a strong mechanical connection to the leadframe 200 without the necessity of an adhesive. However, an adhesive agent may be added to the plastic used to form the package body 230 in order to prevent or reduce an outflow of liquid encapsulant material from the optical cavity 250 through seams or spaces between the plastic material of the package body and the leadframe 200.

The package body 230 may be formed to expose upper surfaces of the die mounting regions 202 of the leadframe 200. The package body 230 may include opposing upper sidewalls 234 that define an optical cavity 250 above the die mounting regions 202. The upper sidewalls 234 may include oblique inner surfaces 238 that define a reflector cup above and surrounding the die mounting regions 202. A lens 240 may be positioned at least partially within the optical cavity 250 above the die mounting regions 202. The optical cavity 250 defined by the package body 230 may be filled, for example, with a liquid encapsulant material, such as liquid silicone and/or epoxy, which may include a wavelength conversion material, such as a phosphor, therein.

The lens 240 may be positioned in contact with a circumferential rim 236 that may be defined within the sidewalls 234 as shown in FIG. 5 and/or may be a separate feature of the body 230. Furthermore, the sidewalls 234 may include a circumferential moat 232 outside the circumferential rim 236. As explained above, the circumferential moat 232 may be particularly useful when a liquid encapsulant such as silicone is used as an encapsulant for the package 260 to reduce or prevent squeeze-out of the encapsulant material during or after package assembly.

A plurality of solid state light emitting devices 214 are mounted on respective ones of the die mounting regions 202, which are electrically connected to respective ones of the first electrical leads 206. Wirebond connections 216 are made between the light emitting devices 214 and respective ones of the second electrical leads 204.

Figure 7:
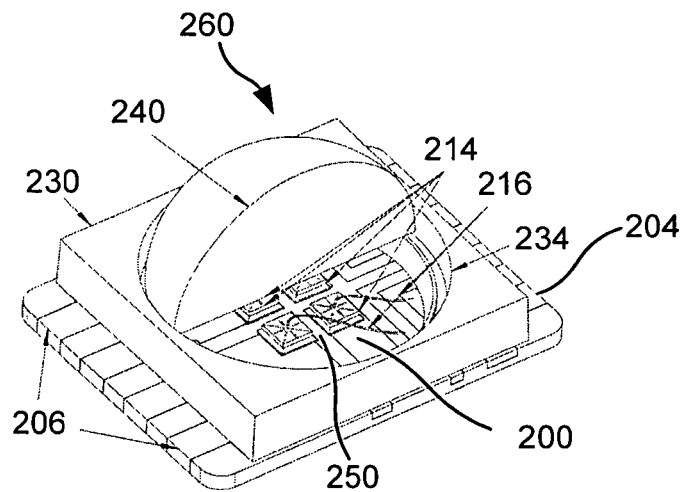
FIG. 7 is a cutaway view of a package for one or more light emitting devices according to embodiments of the invention.

FIG. 7 is a perspective cutaway view of a package 260 according to embodiments of the invention showing a package body 230 molded onto a leadframe 200. Four solid state light emitting devices 214 are mounted on the leadframe 200 within the optical cavity 250 defined by the sidewalls 234 of the package body 230. The solid state light emitting devices are connected by wirebonds 216 to respective ones of the second electrical leads 204, which extend from a side of the package opposite the first electrical leads 206. A lens 240 is positioned above the optical cavity 250.

Figure 8:
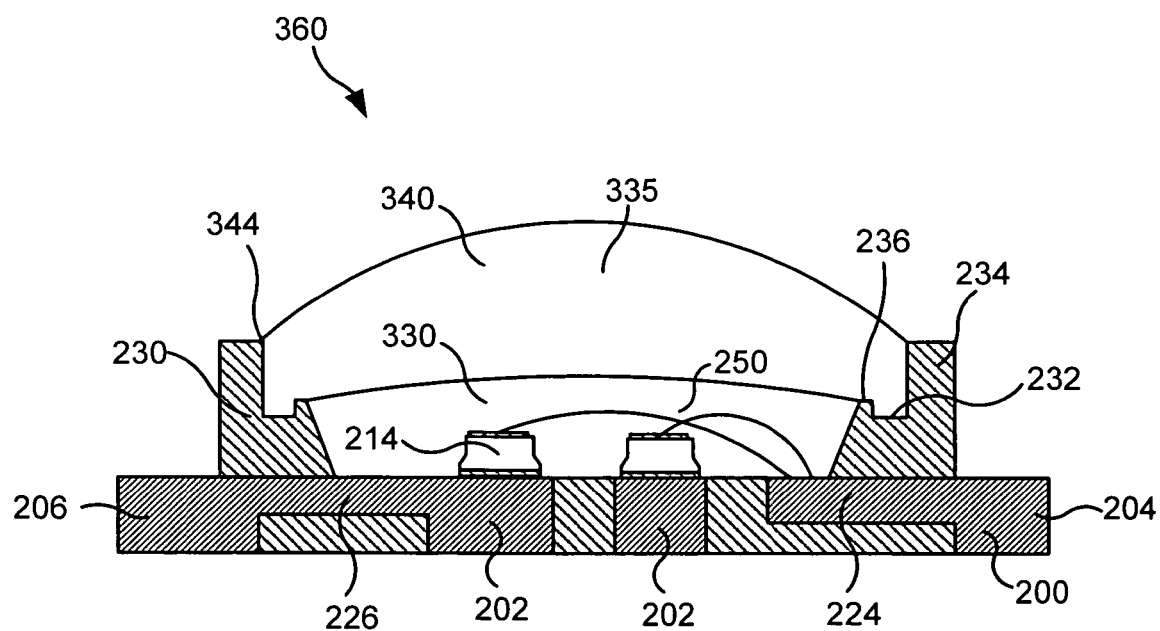
FIG. 8 is a cross sectional side view of a package for one or more light emitting devices according to still further embodiments of the invention.

FIG. 8 is a cross sectional view of a package 360 for solid state light emitting devices according to further embodiments of the invention. Features of the package 360 having the same reference numbers as those shown in FIG. 5 are similar to the corresponding features of the package 260 shown in FIG. 5. In the package 360, instead of providing a separate lens element that is inserted into the package, a lens 340 is formed by dispensing a liquid encapsulant material into the cavity formed by the sidewalls 230 and curing the liquid encapsulant. Dispensed lenses are discussed in U.S. patent application Ser. No. 11/197,096 entitled "Packages for Semiconductor Light Emitting Devices Utilizing Dispensed Encapsulants and Methods of Packaging the Same" filed Aug. 4, 2005, which is assigned to the assignee of the present invention, and the disclosure of which is incorporated herein by reference.

In particular, after the light emitting devices 214 have been mounted on the die attach regions 202, a first dispense of encapsulant material 330 may be performed to cover the devices 214. The material of the first dispense may include a wavelength conversion material such as a phosphor. The first encapsulant material 330 may form a convex, flat, or concave meniscus defined by the circumferential rim 236 of the sidewall portions 234, which may be provided with sharp edge to facilitate the formation of the meniscus. After the encapsulant material 330 has been at least partially cured, a second dispense of encapsulant material 335 may be performed. The second encapsulant material 335 may be formed to have a concave, flat, or convex meniscus defined by an upper edge 344 of the sidewall portions 234 depending on the amount of material dispensed. The second encapsulant material 335 may then be cured to form a lens 340 above the optical cavity 250.

Embodiments of the invention may permit the formation of packages for solid state light emitting devices in which multiple high-power devices are arranged in close proximity, which results in a higher optical quality emission with better color mixing. Furthermore, assembly of a package according to embodiments of the invention may be simplified, since the package body may be formed through injection molding techniques.

According to some embodiments of the invention, a leadframe-based package for one or more solid state light emitting devices may provide a short thermal path between the solid state light emitting devices and an external heatsink, since the light emitting devices are mounted on one side of the heatsink, while the opposite side of the leadframe is used to contact an external heatsink. Furthermore, the surface area of the leadframe through which heat is extracted may be larger than the die mounting area, which may improve heat extraction.

The foregoing description is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A modular package for a light emitting device, comprising:
   a leadframe having a top surface and including a central region having a bottom surface and having a first thickness between the top surface of the leadframe and the bottom surface of the central region wherein the central region comprises a plurality of electrically isolated die mounting regions that are configured to receive respective light emitting devices, the leadframe further including a first plurality of electrical leads that are integral to respective die mounting regions of the central region and that extend laterally away from a first side of the central region, each of the first electrical leads including a first region proximate the central region and having a bottom surface and a second thickness from the top surface of the leadframe to the bottom surface of the electrical lead adjacent the central region, wherein the second thickness is less than the first thickness; and
   a package body on the leadframe surrounding the central region and exposing bottom surfaces of the die mounting regions;
   wherein each of the first electrical leads further comprises a second region distal from the central region, the second region having the first thickness;
   wherein the package body is at least partially provided beneath the bottom surface of the first region of the lead and adjacent the bottom surface of the central region; and
   wherein the leadframe comprises a plurality of second electrical leads adjacent a second side of the central region opposite the first side of the central region and that are not electrically connected to die mounting regions.

2. The modular package of claim 1, wherein the package body includes upper sidewalls that define an optical cavity above the die mounting region.

3. The modular package of claim 2, wherein the upper sidewalls include oblique inner surfaces that define a reflector cup surrounding the die mounting region.

4. The modular package of claim 3, further comprising an encapsulant above the reflector cup, the encapsulant defining a lens above the reflector cup.

5. The modular package of claim 1, wherein the package body defines an optical cavity above the top surface of the leadframe, and at least a portion of the package body extends through the leadframe.

6. The modular package of claim 3, further comprising a submount on a base of the reflector cup, a solid state light emitting device on the submount, and a wirebond connection from the solid state light emitting device to at least one of the first electrical leads.

7. The modular package of claim 1, wherein the package body has a bottom surface that is substantially coplanar with the bottom surface of the central region of the leadframe and with the second portion of the lead.

8. The modular package of claim 1, wherein the first thickness is less than 30 mils.

9. The modular package of claim 8, wherein the first thickness is about 15 mils.

10. The modular package of claim 1, wherein the first region of the leadframe is between the central region and the second region of the leadframe.

11. The modular package of claim 1, wherein the first region defines a recess in the leadframe opposite the top surface of the leadframe.

12. A modular package for a light emitting device, comprising:
   a leadframe having a top surface and including a central region having a bottom surface and having a first thickness between the top surface of the leadframe and the bottom surface of the central region, wherein the central region comprises a plurality of electrically isolated die mounting regions, the leadframe further including a plurality of first electrical leads that are integral and electrically connected to respective die mounting regions of the central region and that extend laterally away from and are electrically connected to the respective die mounting regions of the central region, the first electrical leads each including a first region proximate the respective die mounting regions of the central region and having a bottom surface and a second thickness from the top surface of the leadframe to the bottom surface of the electrical lead adjacent the central region, wherein the second thickness is less than the first thickness; and
   a package body on the leadframe surrounding the central region and exposing the bottom surface of the central region;
   wherein each of the first electrical leads further comprises a second region distal from the central region, the second region having the first thickness;
   wherein the package body is at least partially provided beneath the bottom surface of the first region of the first electrical leads and adjacent the bottom surface of the central region;
   wherein the first electrical leads extend from a first side of the modular package;
   wherein the package includes a second side opposite the first side; and
   wherein the leadframe comprises a plurality of second electrical leads that are not electrically connected to die mounting regions and that extend from the second side of the package.

13. The modular package of claim 12, further comprising an LED chip mounted to one of the die mounting regions that provides electrical connection between the LED chip and one of the first electrical leads.

14. The modular package of claim 13, further comprising:
   an encapsulant material on the leadframe in an optical cavity defined by the package body; and
   a lens on the package body.

15. A leadframe for a package for a light emitting device, comprising:
   a top surface;
   a central region having a bottom surface and having a first thickness between the top surface of the leadframe and the bottom surface of the central region wherein the central region comprises a plurality of electrically isolated die mounting regions; and
   a first plurality of electrical leads that are integral to respective die mounting regions of the central region and that extend laterally away from a first side of the central region and are electrically connected to the die mounting regions, each of the first plurality of electrical leads comprising:
   a first region proximate the respective die mounting regions of the central region and having a bottom surface and a second thickness from the top surface of the leadframe to the bottom surface of the electrical lead adjacent the central region, wherein the second thickness is less than the first thickness; and
   a second region distal from the central region, the second region having the second thickness;
   wherein the central region includes a second side opposite the first side; and
   wherein the leadframe comprises a plurality of second electrical leads adjacent the second side of the central region and that are not electrically connected to die mounting regions.

16. The leadframe of claim 15, further comprising a plurality of LED chips mounted to respective ones of the die mounting regions, wherein each of the die mounting regions provides electrical connection between a respective one of the LED chips and a respective one of the first electrical leads.

* * * * *

UNITED STATES PATENT AND TRADEMARK OFFICE
CERTIFICATE OF CORRECTION

PATENT NO. : 7,960,819 B2  
APPLICATION NO. : 11/486244  
DATED : June 14, 2011  
INVENTOR(S) : Loh et al.

Page 1 of 1

It is certified that error appears in the above-identified patent and that said Letters Patent is hereby corrected as shown below:

In the Claims:

Column 12, Claim 1, Line 47: Please correct "electrically connected to die mounting"
to read -- electrically connected to the die mounting --

Claim 2, Line 50: Please correct "die mounting region."
to read -- die mounting regions. --

Claim 3, Line 53: Please correct "die mounting region."
to read -- die mounting regions. --

Column 14, Claim 12, Line 2: Please correct "electrically connected to die"
to read -- electrically connected to the die --

Claim 15, Line 39: Please correct "electrically connected to die"
to read -- electrically connected to the die --

Signed and Sealed this
Eighteenth Day of October, 2011

David J. Kappos
*Director of the United States Patent and Trademark Office*